United States Patent [19]

Masukawa

[11] Patent Number: 5,753,974
[45] Date of Patent: May 19, 1998

[54] ELECTRONIC DEVICE ASSEMBLY

[75] Inventor: Fuminori Masukawa, Tokyo, Japan

[73] Assignee: NEC Corporation, Tokyo, Japan

[21] Appl. No.: 521,837

[22] Filed: Aug. 31, 1995

[30] Foreign Application Priority Data

Sep. 12, 1994 [JP] Japan .................................. 6-216853

[51] Int. Cl.$^6$ .......................... H01L 23/48; H01L 23/52; H01L 29/40
[52] U.S. Cl. .......................... 257/737; 257/774; 257/784
[58] Field of Search .................................. 257/737, 777, 257/686, 685, 738, 778, 774, 784, 672, 673, 675, 668, 666, 781, 698

[56] References Cited

U.S. PATENT DOCUMENTS

| | | | |
|---|---|---|---|
| 4,970,575 | 11/1990 | Soga et al. | 257/688 |
| 4,979,015 | 12/1990 | Stierman et al. | 257/778 |
| 5,097,318 | 3/1992 | Tanaka et al. | 257/704 |
| 5,289,346 | 2/1994 | Carey et al. | 257/778 |
| 5,331,514 | 7/1994 | Kuroda | 257/686 |
| 5,468,995 | 11/1995 | Higgins, III | 257/778 |

FOREIGN PATENT DOCUMENTS

0337686A2  10/1989  European Pat. Off. .
62194650   8/1987   Japan .
WO9205582  4/1992   WIPO .

OTHER PUBLICATIONS

T.L. Hodson, Ed.; "Die Grid Array Package Provides KGD Solution"; Electronic Packaging & Production 34 (1994) Jun., No. 6, Newton, Mass., p. 40.

Primary Examiner—Mahshid D. Saadat
Assistant Examiner—Jhihan B. Clark
Attorney, Agent, or Firm—Whitham, Curtis, Whitham & McGinn

[57] ABSTRACT

An electronic device assembly includes a large-scale-integrated circuit (LSI) chip having center and peripheral portions. A circuit and terminals are formed in the center in and peripheral portions, respectively. A carrier substrate is attached to the center portion of the LSI chip. The carrier substrate has center and peripheral portions. Bumps and terminals are provided in the center and peripheral portions of the carrier substrate. Wires connect the terminals of the LSI chip and the carrier substrate. The carrier substrate is mounted on a substrate via the bumps. The thermal expansion coefficient of the carrier substrate is between those of the LSI chip and the substrate.

9 Claims, 7 Drawing Sheets

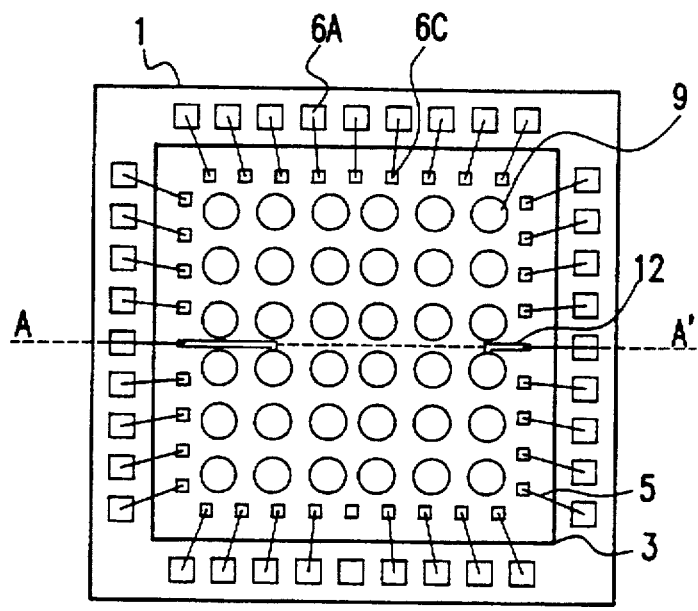
FIG.1A
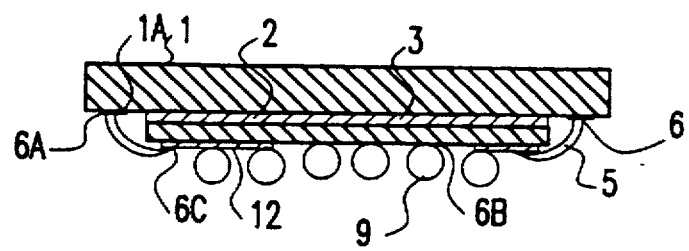
FIG.1B
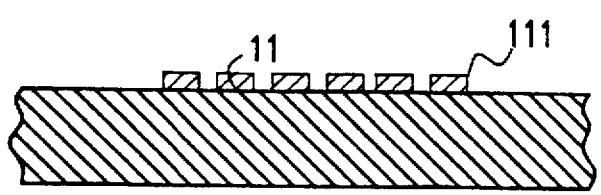

| NAME OF MATERIAL | THERMAL EXPANSION COEFFICIENT (20~400 °C) [×$10^{-6}$/°C] | HEAT CONDUCTIVITY (ROOM TEMPERATURE) [W/M·K] |
| --- | --- | --- |
| Si (SINGLE CRYSTAL) | 3.6 | 125 |
| SiC (SINGLE CRYSTAL) | 4.2 | 270 |
| SiC (HIGH HEAT CONDUCTIVE) | 3.7 | 60~490 |
| $Al_2O_3$ (92%) | 6.5 | 17 |
| AlN (95~99.5%) | 4.2 | 60~270 |
| BeO (99.5%) | 7.5 | 260 |
| Cu | 17.5 | 394 |
| Au | 14.2 | 313 |
| Al | 26.5 | 239 |

FIG.7

ELECTRONIC DEVICE ASSEMBLY

BACKGROUND OF THE INVENTION

The present invention relates to an electronic device assembly in which a large-scale-integrated circuit chip (hereinafter referred to as an LSI chip) is mounted on a substrate face down or upside-down, and more particularly to an electronic device assembly for enhancing the thermal mismatch reliability of joints between the LSI chip and the substrate.

Fatigue failure of a connection between a chip and a substrate can be caused by the difference in the thermal expansion coefficient between them (i.e., the thermal mismatch).

A conventional technique for improving fatigue life of the connection is disclosed in Rao R. Tummala and Eugene J. Rymaszewski, "Microelectronics Packaging Handbook", 1989, Van Nostrand Reinhold, New York, pp. 385–390.

Referring to FIG. 6–23 of the reference, an epoxy resin with a coefficient of thermal expansion similar to that of solder is provided between a LSI and a substrate. The epoxy resin encapsulates a bump between the LSI and the substrate. The thermal cycle lifetime of the bump is improved by the resin.

However, the stress caused by the thermal mismatch cannot be relieved sufficiently by the aforementioned technique.

SUMMARY OF THE INVENTION

In view of the aforementioned problem, one object of the present invention is to enhance the lifetime and reliability of a connection between a chip and a substrate.

Another object of the present invention is to improve the thermal cycle lifetime of the connection.

Yet another object of the present invention is to prevent the fatigue failure of the connection due to thermal mismatch.

Yet another object of the present invention is to enhance the reliability of an electronic device assembly.

Yet another object of the present invention is to improve the productivity of an electronic device assembly.

Yet another object of the present invention is to enhance heat dissipation in an electronic device assembly.

Yet another object of the present invention is to provide an electronic device assembly that allows a wider lead bonding pitch without a decrease in lead density.

Yet another object of the present invention is to improve the packaging density of an electronic device assembly.

Yet another object of the present invention is to improve the electrical characteristics of an electronic device assembly.

Yet another object of the present invention is to reduce noise in an electronic device assembly.

According to the present invention, an electronic device assembly comprises a device, a first substrate, a second substrate, a bump, and connecting means. The device has a first surface, a second surface, and a first terminal on the second surface. A circuit is formed on the second surface of the device. The first substrate has a first surface, a second surface, and a first pad on the first surface thereof. The second substrate has a first surface, a second surface, and a second pad on the second surface. The first surface of the second substrate is attached to the second surface of the device. The thermal expansion coefficient of the second substrate is between the thermal expansion coefficient of the device and the thermal expansion coefficient of the first substrate. The bump connects the first and second pads. The connecting means electrically connects the first terminal of the device and the second pad of the second substrate.

The device may have a central portion and a peripheral portion. The first terminal is provided in the peripheral portion of the device. The second substrate has a central portion and a peripheral portion. The second pad is provided in the central portion of the second substrate.

The second substrate may have a second terminal electrically connected to the second pad in the peripheral portion on the second surface thereof. The second substrate is attached to the central portion of the device. The connecting means comprises a lead connecting the first and second terminals.

The electronic device assembly may further include a third substrate interposed between the device and the second substrate. The thermal expansion coefficient of the third substrate is between the thermal expansion coefficient of the device and the thermal expansion coefficient of the second substrate.

The device may have a central portion and a peripheral portion, the first terminal may be provided in the peripheral portion of the device, and the second substrate may be attached to the central portion of the device. The connecting means comprises a lead having first and second ends. The first end of the lead is connected to the first terminal of the device. The second end of the lead is attached to the second substrate and is electrically connected to a through-hole provided in the third substrate.

The second end of the lead may be attached to the first surface of the second substrate. The second substrate has a through-hole between the first and second surfaces for electrically connecting the lead and the second pad.

The second substrate may have a center portion and a peripheral portion. The first terminal includes a third terminal and a fourth terminal adjacent to the third terminal. The connecting means includes first and second leads each having first and second ends. The first ends of the first and second leads are coupled to the third and fourth terminals, respectively. The second ends of the first and second leads are attached to the center and peripheral portions of the second substrate, respectively.

The connecting means may include a lead having first and second ends and an intermediate portion between the first and second ends. The first end of the lead is coupled to the first terminal. The intermediate portion of the lead is attached to the second substrate. The second end of the lead outwardly protrudes from the second substrate and is coupled to the first surface of the first substrate.

The first terminal of the device may be covered with the second substrate. The second substrate has a through-hole between the first and second surface thereof connected to the second pad.

A resin may be interposed between the device and the second substrate. The device has a central portion and a peripheral portion. The first terminal is provided in the peripheral portion of the device. The second substrate is attached to the central portion of the device. The connecting means comprises a lead having first and second ends. The first end of the lead is connected to the first terminal of the device. The second end of the lead is attached to the second substrate and is electrically connected through a through-hole formed in the second substrate.

The device may comprise silicon. The first substrate may comprise glass epoxy. The second substrate may comprise either aluminum nitride, silicon carbide or beryllium oxide.

The device may comprise silicon. The first substrate may comprise glass epoxy. The second substrate may comprise polyimide. The third substrate may comprise either aluminum nitride, silicon carbide or beryllium oxide.

BRIEF DESCRIPTION OF THE DRAWINGS

Other objects, features and advantages of the present invention will become more apparent when the following description is read in conjunction with the accompanying drawings, wherein:

FIGS. 1(a) and 1(b) show the structure of a first embodiment of the present invention.

FIG. 7 shows the thermal expansion coefficient and the heat conductivity of materials that may be used as a carrier substrate.

In these drawings, the same reference numerals depict the same parts, respectively.

DETAILED DESCRIPTION OF THE PREFERRED EMBODIMENTS

Figure 2A:
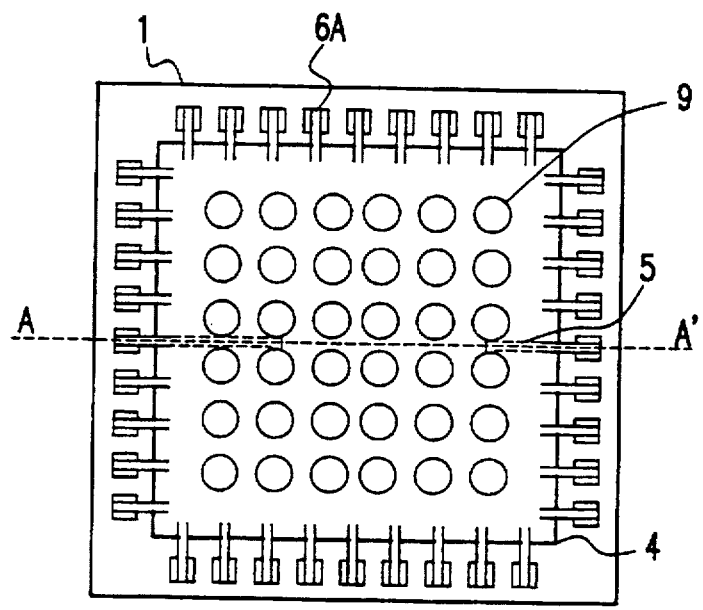
FIGS. 2(a) and 2(b) show the structure of a second embodiment of the present invention.

Next is described a first embodiment of the present invention.

Referring to FIGS. 1(a) and 1(b), an electronic device assembly according to the first embodiment of the present invention includes an LSI chip 1, a carrier substrate 3, and substrate 11.

The LSI chip 1 has a circuit provided in the lower surface thereof which generates heat. The circuit is covered with a protection layer (not shown in the figures) formed from, for example, silicon dioxide ($SiO_2$), silicon dioxide ($SiO_2$) and silicon oxynitride (SiON), or silicon nitride ($Si_3N_4$). The LSI chip 1 has a plurality of terminals 6a along the periphery of the lower surface thereof. The terminals 6a are aligned along the side of the LSI chip 1. The thickness of the LSI chip 1 is about 0.1 mm.

The carrier substrate 3 is attached to the lower surface of the LSI chip 1 via an adhesive 2. The carrier substrate 3 is formed smaller than the LSI chip 1 so that the carrier substrate 3 does not cover the terminals 6a of the LSI chip 1. The thickness of the carrier substrate 3 is about 0.1 mm.

The carrier substrate 3 has a plurality of terminals 6c along the periphery of the lower surface thereof. The terminals 6c are aligned along the side of the carrier substrate 2 to correspond to terminals 6a.

The carrier substrate 3 has a plurality of pads 6b on the lower surface thereof. The pads 6b are disposed in an array. Each pad 6b is connected to the corresponding terminal 6c via a wiring 12 provided on the lower surface of the carrier substrate 3. A solder bump 9 is provided on each pad 6b.

The substrate 11 can be formed from various materials. The substrate 11 may be formed from a composite material including glass epoxy as, the main component. The substrate 11 may also be formed from a ceramic including alumina ($Al_2O_3$)

The substrate 11 has a plurality of pads 111 corresponding to pads 6b of the carrier substrate 3. When the carrier substrate 3 is mounted on the substrate 11, a pad 6b is connected to a corresponding pad 111 via the solder bump 9.

The terminal 6a of the LSI chip 1 is connected to the terminal 6c of the carrier substrate 3 via a wire 5. The preferable materials for the wire 5 includes gold (Au), aluminum (Al), and Copper (Cu). The wire 5, the terminal 6a and 6c are encapsulated in resin 10.

Next is described the materials for the carrier substrate 2.

The thermal expansion coefficient of the carrier substrate 2 is between those of the LSI chip 1 and the substrate 11. Moreover, the material of the carrier substrate 3 preferably has a relatively high heat conductivity.

For example, where the LSI chip 1 and the substrate 11 are formed from silicon and glass epoxy, the carrier substrate 3 can be formed from aluminum nitride (AlN), silicon carbide (SiC) or beryllium oxide (BeO). The thermal expansion coefficients of silicon and glass epoxy are $3.6 \times 10^{-6}/°C$. and $16 \times 10^{-6}/°C$., respectively. The thermal expansion coefficient of aluminum nitride (AlN), silicon carbide (SiC) and beryllium oxide (BeO) are approximately $4.2 \times 10^{-6}/°C$., $4.2 \times 10^{-6}/°C$. and $7.5 \times 10^{-6}/°C$., respectively. The heat conductivities of aluminum nitride (AlN) silicon carbide (SiC), and beryllium oxide (BeO) are approximately 150 to 250 w/mk, 270 w/mk and 250 w/mk.

Next is described the materials for the adhesive 2.

The adhesive 2 preferably comprises an insulating material having a relatively high heat conductivity. Preferable materials for the adhesive 2 include an epoxy-type adhesive including particles of silver, boron nitride (BN), alumina ($Al_2O_3$) or aluminum nitride (AlN). The heat conductivities of epoxy-type adhesives including silver, boron nitride (BN), and aluminum nitride (AlN) are approximately 1.56 w/mk, 5 w/mk and 5 w/mk, respectively.

Next is described the technical advantages of the first embodiment.

In the first embodiment, fatigue failure of the connection due to thermal mismatch is prevented because the strain is relieved by the carrier substrate 3 interposed between the LSI chip 1 and the substrate 11. That is, the carrier substrate 3 having an intermediate thermal expansion coefficient serves to buffer or compensate for the difference in thermal expansion coefficients of the LSI chip 1 and the substrate 11.

In the first embodiment, the package density is improved because the bumps 9 are provided under the LSI chip 1 even though the LSI chip 1 has the terminals 6a along the periphery thereof.

Next is described a second embodiment of the present invention. A key feature of the second embodiment is a flexible substrate 4 attached to the carrier substrate 3.

Figure 2B:
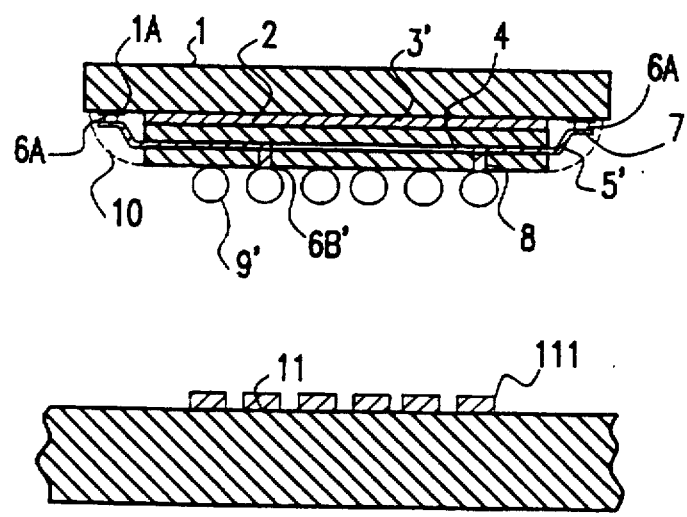

Referring to FIGS. 2(a) and 2(b), the structure of the LSI chip 1 is the same as that of the first embodiment.

The carrier substrate 3' is attached to the lower surface of the LSI chip 1 via the adhesive 2.

A flexible substrate 4 is attached to the lower surface of the carrier substrate 3'. The flexible substrate 3' is provided with leads 5'. One end of the lead 5' is attached to the upper surface of the flexible substrate 3'. A gold bump 7 is provided at another end of the lead 5'. The lead 5' is coupled to the terminal 6a of the LSI chip 1 via the gold bump 7. The terminal 6a is formed from aluminum. An eutectic alloy of gold and aluminum is formed between the gold bump 7 and the terminal 6a. The terminal 6a and the lead 5' are encapsulated in the resin 10.

The inner lead 5' can be bonded to the terminal 6a by tape automated bonding (TAB) techniques such as a bump-transfer process, a bump-tape automated bonding (B-TAB) process, or a micro-press bump process. In the bump transfer process, the plurality of the leads 5' are positioned on the terminals 6a and bonded to the terminals 6a simultaneously. In the B-TAB process, the gold bump 7 is prepared by half-etching one side of the lead 5' and plating nickel and gold on the protrusion formed by the etching. In the micro-press bump process, the end of the inner lead 5' is mechanically cut with a micro-die system to form a protrusion.

The flexible substrate 4 has through-holes 8 therein. The through-hole 8 is filled with a conductive material. The through-hole 8 filled with the conductive material is electrically connected to the lead 5' via a conductive pattern (not shown in the figures) provided on the upper surface of the flexible substrate 4.

The flexible substrate 4 has pads 6b' on the lower surface thereof. The pads 6b' are disposed in an array. Each pad 6b' is coupled to the corresponding through-hole 8. Solder bumps 9' are provided on the pad 6b'. Thus, the solder bump 9' is electrically connected to the terminal 6a of the LSI chip 1.

Next is described the materials of the carrier substrate 3' and the flexible substrate 4.

The thermal expansion coefficients of the carrier substrate 3' and the flexible substrate 4 are between those of the LSI chip 1 and the substrate 11. The thermal expansion coefficient of the flexible substrate 4 is preferably between those of the carrier substrate 3 and the substrate 11.

Preferred materials for the carrier substrate 3' are the same as those of the carrier substrate 3 of the first embodiment.

In this exemplary embodiment, the flexible substrate 3' is formed from polyimide. Polyimide has a thermal expansion coefficient of approximately $11 \times 10^{-6}/°C$.

When an epoxy glass substrate is used as the substrate 11, the thermal coefficients of the carrier substrate 3' (4.2 to 7.25 $\times 10^{-6}/°C$.), the flexible substrate 4 ($11 \times 10^{-6}/°C$.) and the substrate 11 ($16 \times 10^{-6}/°C$.) satisfy the aforementioned relationship.

Next is described the technical advantages of the second embodiment.

In addition to the advantages of the first embodiment, the second embodiment can further improve the reliability of the connection because the stress due to thermal mismatch is relieved (e.g., compensated) by the flexible substrate 4 as well as the carrier substrate 3'.

Moreover, well-known TAB techniques can be used in the fabrication and the bonding of the flexible substrate 4.

Next is described a third embodiment of the present invention. A key feature of the third embodiment is a peripheral portion of the flexible substrate 4 provided to increase the number of the bumps 9'.

Figure 3A:
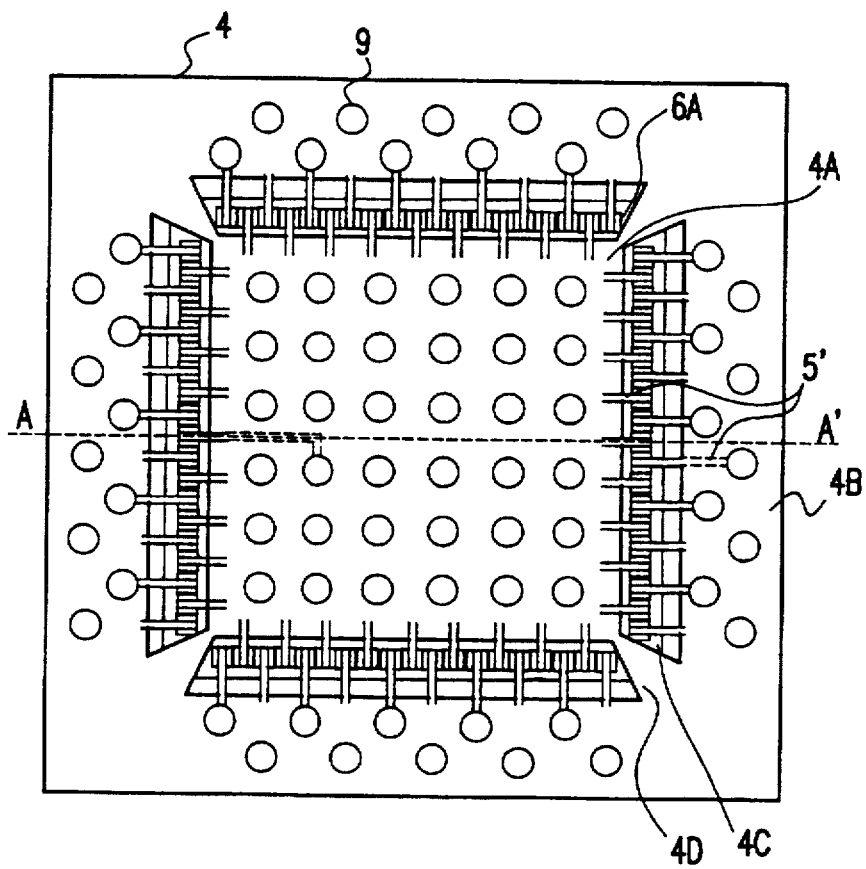
FIGS. 3(a) and 3(b) show the structure of a third embodiment of the present invention.
Figure 3B:
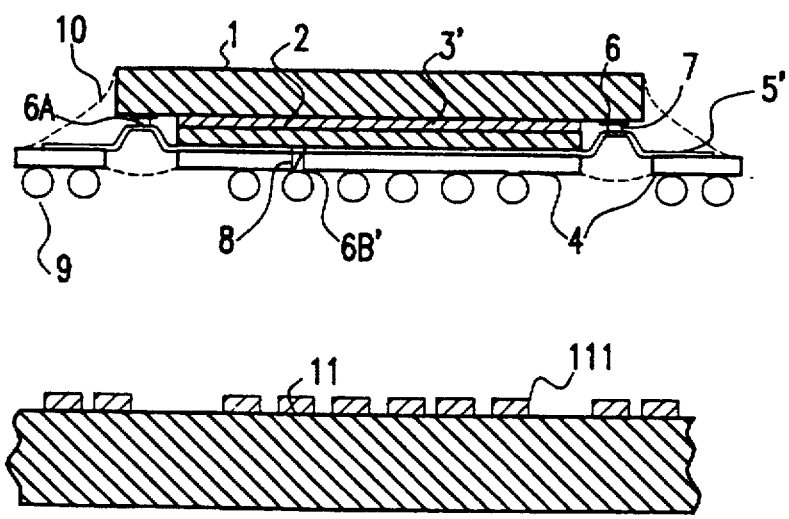

Referring to FIGS. 3(a) and 3(b), the structure of the LSI chip 1 and the carrier substrate 3' are the same as those of the second embodiment.

The flexible substrate has a center portion 4a, a peripheral portion 4b, openings between the center portion 4a and the peripheral portion 4b and bridge portions 4d connecting the center portion 4a and the peripheral portion 4b. The center portion 4a is attached to the carrier substrate 3'.

The through-hole 8, the pad 6b and the bump 9 are provided in both the center portion 4a and the peripheral portion 4b.

The leads 5' are alternately attached to the center portion 4a or the periphery portion 4b of the flexible substrate 4. The lead pitch in the central portion 4a and the peripheral portion 4b is twice as wide as that of the terminals 6a. The leads 5' are electrically connected to the through-holes 8 in the center portion 4a of the peripheral portion 4b via conductive patterns provided on the upper surface of the flexible substrate 4.

When the leads 5' are bonded to the terminals 6a, a thermode is inserted in the openings 4c. The leads 5' are reachable through the openings 6c.

Next is described the technical advantages of the third embodiment.

In addition to the advantages of the second embodiment, in the third embodiment, the lead pitch on the flexible substrate 4 is twice as wide as that of the second embodiment. Thus, the bonding process is performed more easily than in the second embodiment.

Moreover, the third embodiment can accommodate more bumps 9 than the second embodiment.

Next is described the fourth embodiment of the present invention. A key feature of the fourth embodiment is a lead outwardly protruding from the peripheral portion 4b.

Figure 4A:
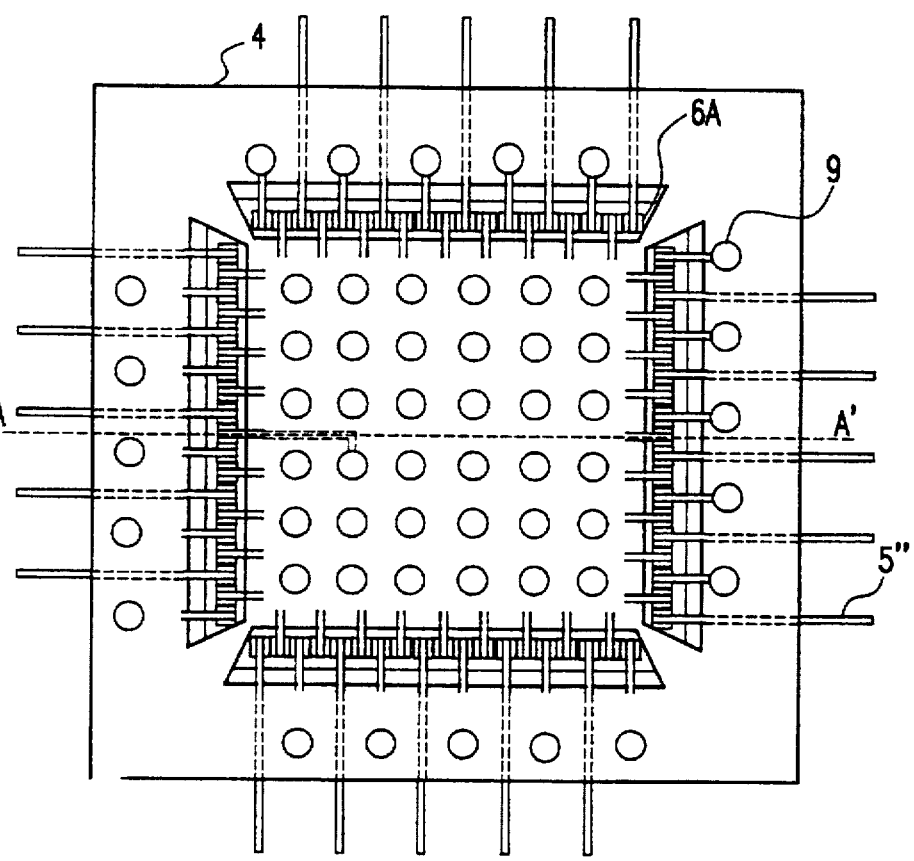
FIGS. 4(a) and 4(b) show the structure of a fourth embodiment of the present invention.
Figure 4B:
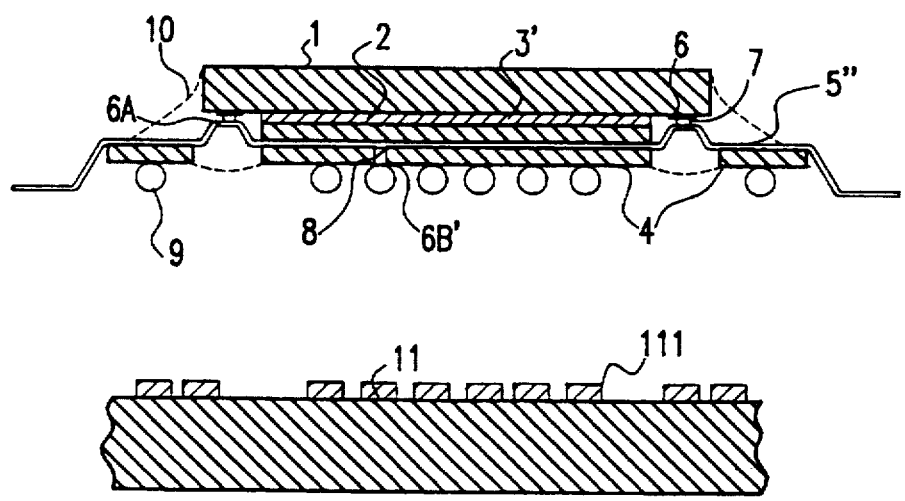

Referring to FIGS. 4(a) and 4(b), every other lead 5" on the peripheral portion 4b outwardly protrudes from the peripheral portion 4b. The lead 5" has first and second ends and an intermediate portion between the first and second ends. The first end is coupled to the terminal 6a of the LSI chip 1. The intermediate portion is attached to the peripheral portion 4b. The second end protrudes from the peripheral portion 4b and is connected to the pad 111 on the substrate 11.

Next is described the fifth embodiment of the present invention. A key feature of the fifth embodiment is the connecting structure between the terminal 6a of the LSI chip 1 and the bump 9. Other structures and functions are the same as those of the first embodiment.

Figure 5A:
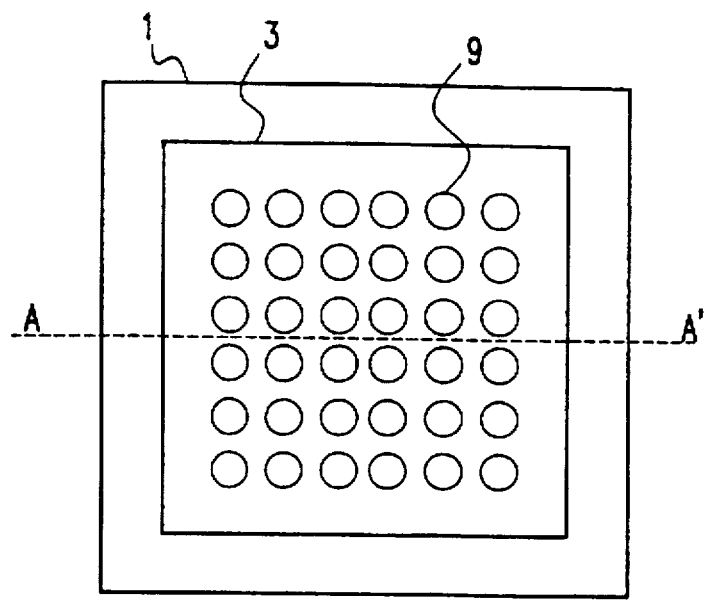
FIGS. 5(a) and 5(b) show the structure of a fifth embodiment of the present invention.
Figure 5B:
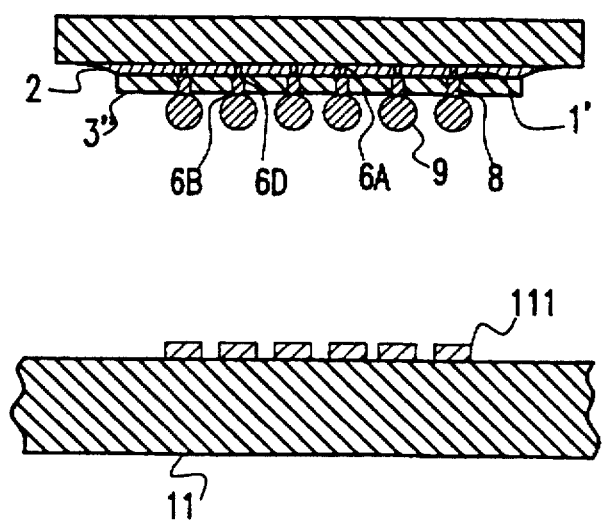

Referring to FIGS. 5(a) and 5(b), in the fifth embodiment, the terminals 6a of the LSI chip 1 are disposed in an array on the lower surface thereof.

The carrier substrate 3" has pads 6d on the upper surface at positions corresponding to the pads 6b on the lower surface. The pads 6b and 6d are disposed in an array. The flexible substrate 3" has a through-hole 8 filled with a conductive material such as aluminum, copper, gold or the like and/or alloys and compounds of the same. The through-hole 8 electrically connects the pads 6a and 6d.

The terminal 6a of the LSI chip 1 is connected to the pad 6d of the carrier substrate 3" via a join (e.g., bump) 1'. The joint 1' is encapsulated in the adhesive 2. Thus, the terminal 6a of the LSI chip 1 is electrically connected to the bump 9.

An advantage of the fifth embodiment is that a more reliable connection is made between the terminal 6a of the LSI chip 1 and the bump 9.

Next is described the sixth embodiment of the present invention. A key feature of the sixth embodiment is a resin 1a replacing the carrier substrate 3'. Other structures and functions are the same as those of the third embodiment.

Figure 6A:
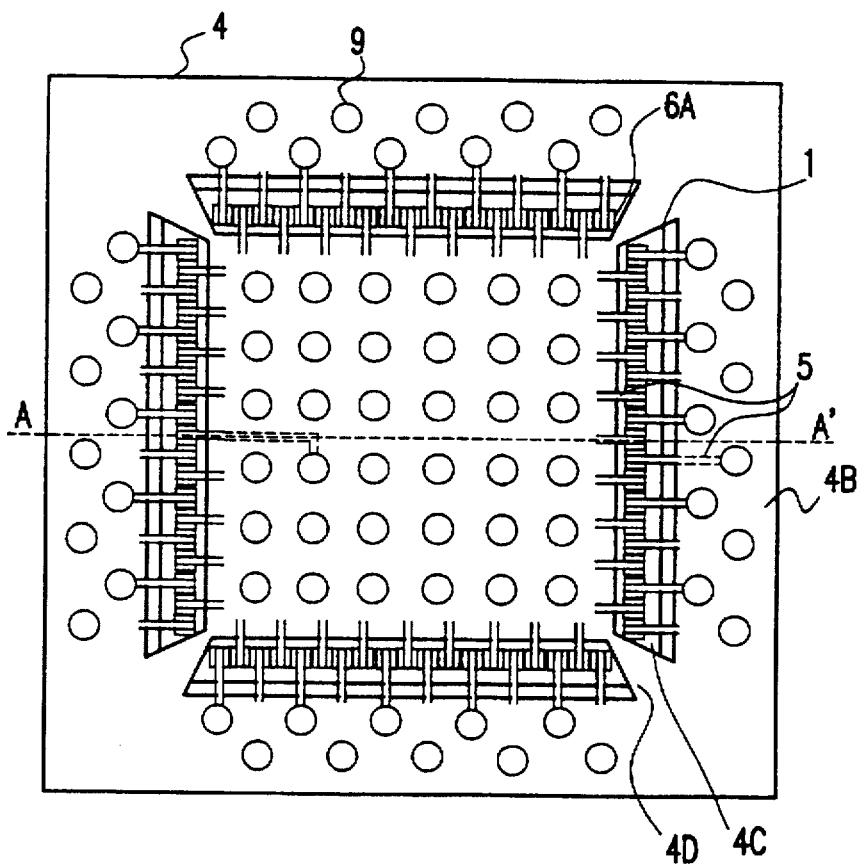
FIGS. 6(a) and 6(b) show the structure of a sixth embodiment of the present invention.
Figure 6B:
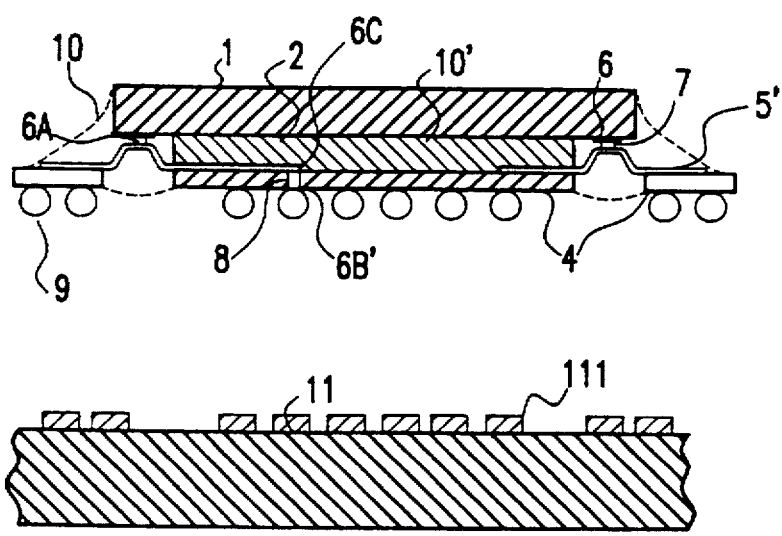

Referring to FIGS. 6(a) and 6(b), the flexible substrate 4 is attached to the LSI chip 1 via a resin 10'. The resin 10' replaces the adhesive 2 and the carrier substrate 3' of the third embodiment. The thickness of the resin 10' is about 0.1 mm. The material of the resin 10' may be the same as that of the adhesive 2.

The thermal expansion coefficient of the resin 10' is preferably between those of the LSI chip 1 and the substrate 11. Preferably, the thermal expansion coefficient is between those of the LSI chip 1 and the flexible substrate 11.

An advantage of the sixth embodiment is that less (and easier) manufacturing steps result by resin 10' being employed in lieu of carrier substrate 3' and adhesive 2.

Next is described the materials for the carrier substrates 3 and 3'.

Referring to FIG. 7, as shown various materials can be used for the carrier substrates 3 and 3' according to the designer's requirements.

The present embodiments are therefore, to be considered in all respects as illustrative and not restrictive, the scope of the invention being indicated by the appended claims rather than by the foregoing description and all changes which come within the meanings and range of equivalency of the claims are therefore intended to the embraced therein.

What is claimed is:

1. An electronic device assembly, comprising:
   a device having a first surface, a second surface, and a first terminal on said second surface, a circuit being, formed on said second surface of said device;
   a first substrate having a first surface, a second surface, and a first pad on said first surface thereof;
   a second substrate having a first surface, a second surface, and a second pad on said second surface, said first surface of said second substrate being attached to said second surface of said device a thermal expansion coefficient of said second substrate being between a thermal expansion coefficient of said device and a thermal expansion coefficient of said first substrate;
   a bump connecting said first and second pads; and
   connecting means for electrically connecting said first terminal of said device and said second pad of said second substrate,
   wherein said device has a central portion and a peripheral portion, said first terminal is provided in said peripheral portion of said device, said second substrate has a central portion and a peripheral portion, and said second pad is provided in said central portion of said second substrate,
   wherein said second substrate has a second terminal provided on said second surface of said second substrate and electrically connected to said second pad in said peripheral portion on said second surface thereof, said second substrate is attached to said central portion of said device, and said connecting means comprises a lead connecting said first and second terminals.

2. An electronic device assembly, comprising:
   a device having a first surface, a second surface, and a first terminal on said second surface, a circuit being formed on said second surface of said device;
   a first substrate having a first surface, a second surface, and a first pad on said first surface thereof,
   a second substrate having a first surface, a second surface, and a second pad on said second surface, said first surface of said second substrate being attached to said second surface of said device, a thermal expansion coefficient of said second substrate being between a thermal expansion coefficient of said device and a thermal expansion coefficient of said first substrate;
   a bump connecting said first and second pads;
   connecting means for electrically connecting said first terminal of said device and said second pad of said second substrate;
   a third substrate interposed between said device and said second substrate, a thermal expansion coefficient of said third substrate being between a thermal expansion coefficient of said device and a thermal expansion coefficient of said second substrate,
   wherein said device has a central portion and a peripheral portion, said first terminal is provided in said peripheral portion of said device, and said third substrate is attached to said central portion of said device,
   wherein said connecting means comprises a lead having first and second ends, said first end of said lead is connected to said first terminal of said device, and said second end of said lead is attached to said second substrate and electrically connected to a through-hole provided in said third substrate.

3. An electronic device assembly according to claim 2, wherein said second end of said lead is attached to said first surface of said second substrate, said second substrate has a throughhole between said first and second surfaces for electrically connecting said lead and said second pad.

4. An electronic device assembly according to claim 2, wherein said second substrate has a center portion and a peripheral portion, and said first terminal includes a third terminal and a fourth terminal adjacent to said third terminal.

5. An electronic device assembly according to claim 2, wherein said second substrate has center and peripheral portions, said connecting means includes a lead having first and second ends and an intermediate portion between said first and second ends, and said first end of said lead is coupled to said first terminal.

6. An electronic device assembly according to claim 4, wherein said connecting means includes first and second leads each having first and second ends, said first ends of said first and second leads are coupled to said third and fourth terminals, respectively, and said second ends of said first and second leads are attached to said center and peripheral portions of said second substrate, respectively.

7. An electronic device assembly according to claim 6, wherein said second substrate has an opening between said center and peripheral portions, and said first and second leads are connected to said third and fourth terminals at said opening, respectively.

8. An electronic device assembly according to claim 5, wherein said intermediate portion of said lead is attached to said second substrate, and said second end of said lead outwardly protrudes from said second substrate and is coupled to said first surface of said first substrate.

9. An electronic device assembly, comprising:
   a device having a first surface, a second surface, and a first terminal on said second surface a circuit being formed on said second surface of said device;
   a first substrate having a first surface, a second surface, and a first pad on said first surface thereof,
   a second substrate having a first surface, a second surface, and a second pad on said second surface, said first surface of said second substrate being attached to said second surface of said device, a thermal expansion coefficient of said second substrate being between a thermal expansion coefficient of said device and a thermal expansion coefficient of said first substrate,
   a bump connecting said first and second pads; and
   connecting means for electrically connecting said first terminal of said device and said second pad of said second substrate,
   wherein a resin is interposed between said device and said second substrate, and
   wherein said device has a central portion and a peripheral portion, said first terminal is provided in said peripheral portion of said device, said second substrate is attached to said central portion of said device, said connecting means comprises a lead having first and second ends, said first end of said lead is connected to said first terminal of said device, and said second end of said lead is attached to said second substrate and electrically connected through a through-hole formed in said second substrate.

* * * * *